United States Patent [19]

Berger

[11] Patent Number: 4,980,546
[45] Date of Patent: Dec. 25, 1990

[54] PHOTOSENSITIVE DEVICE OF THE TYPE WITH AMPLIFICATION OF THE SIGNAL AT THE PHOTOSENSITIVE DOTS

[75] Inventor: Jean-Luc Berger, Grenoble, France
[73] Assignee: Thomson-CSF, Puteaux, France
[21] Appl. No.: 425,412
[22] Filed: Oct. 23, 1989
[30] Foreign Application Priority Data Oct. 25, 1988 [FR] France .................. 88 13913

[51] Int. Cl.$^5$ .............................................. H01J 40/14
[52] U.S. Cl. .............................. 250/208.1; 250/211 J; 357/30
[58] Field of Search ............... 250/211 J, 208.1, 208.2; 357/30 H, 24 LR

[56] References Cited
U.S. PATENT DOCUMENTS 4,808,822 2/1989 Manning et al. ................ 250/208.1

FOREIGN PATENT DOCUMENTS 0046396 2/1982 European Pat. Off. .
0128828 12/1984 European Pat. Off. .
2605166 4/1988 France .

OTHER PUBLICATIONS

Patent Abstracts of Japan, vol. 7, No. 162, (E-187) (1307), Jul. 15, 1983, & JP-A-58 68 966, K. Hatanaka, "Photoelectric Transducer".

Primary Examiner—David C. Nelms
Attorney, Agent, or Firm—Oblon, Spivak, McClelland, Maier & Neustadt

[57] ABSTRACT

Disclosed is a solid state photosensitive device having photosensitive dots, each of which achieves an amplification of the useful signal by means of a transistor obtained by a technology enabling the making photosensitive devices with large areas. To this end, according to the disclosure, each photosensitive diode has at least one photosensitive element that generates electrical charges stored at a point at floating potential, and has a transistor, the control gate of which is connected to the floating point. The transistor thus fulfils an amplifier function, but does not fulfill a photodetection function, so that it can be made of amorphous silicon, amorphous silicon being a material that can be used in thin layers or thin films on large areas.

18 Claims, 7 Drawing Sheets

FIG_1 PRIOR ART
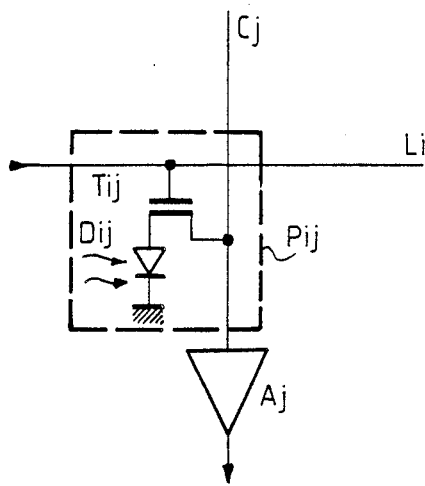
FIG_3
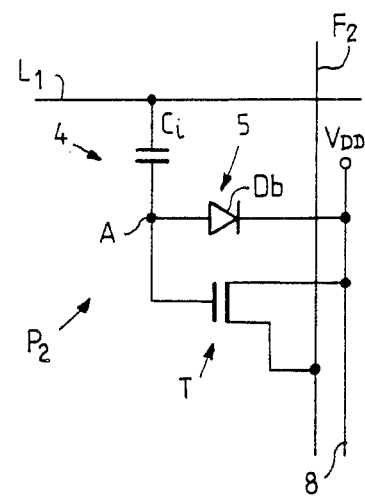
FIG_6
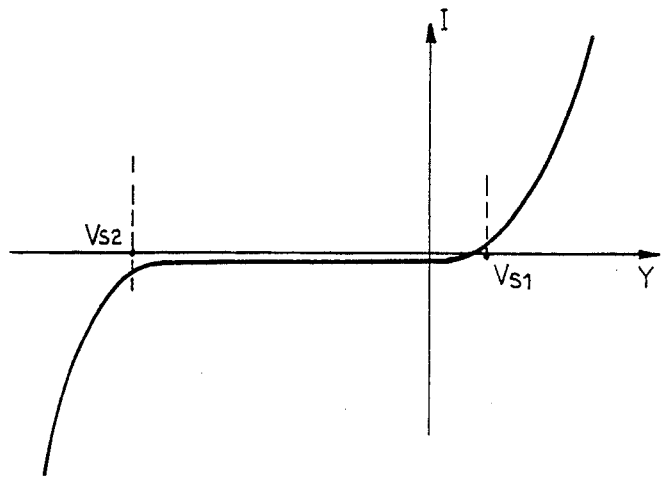
FIG_7
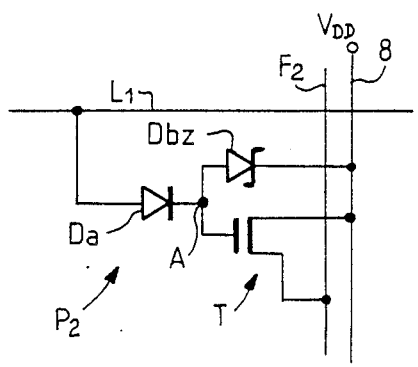

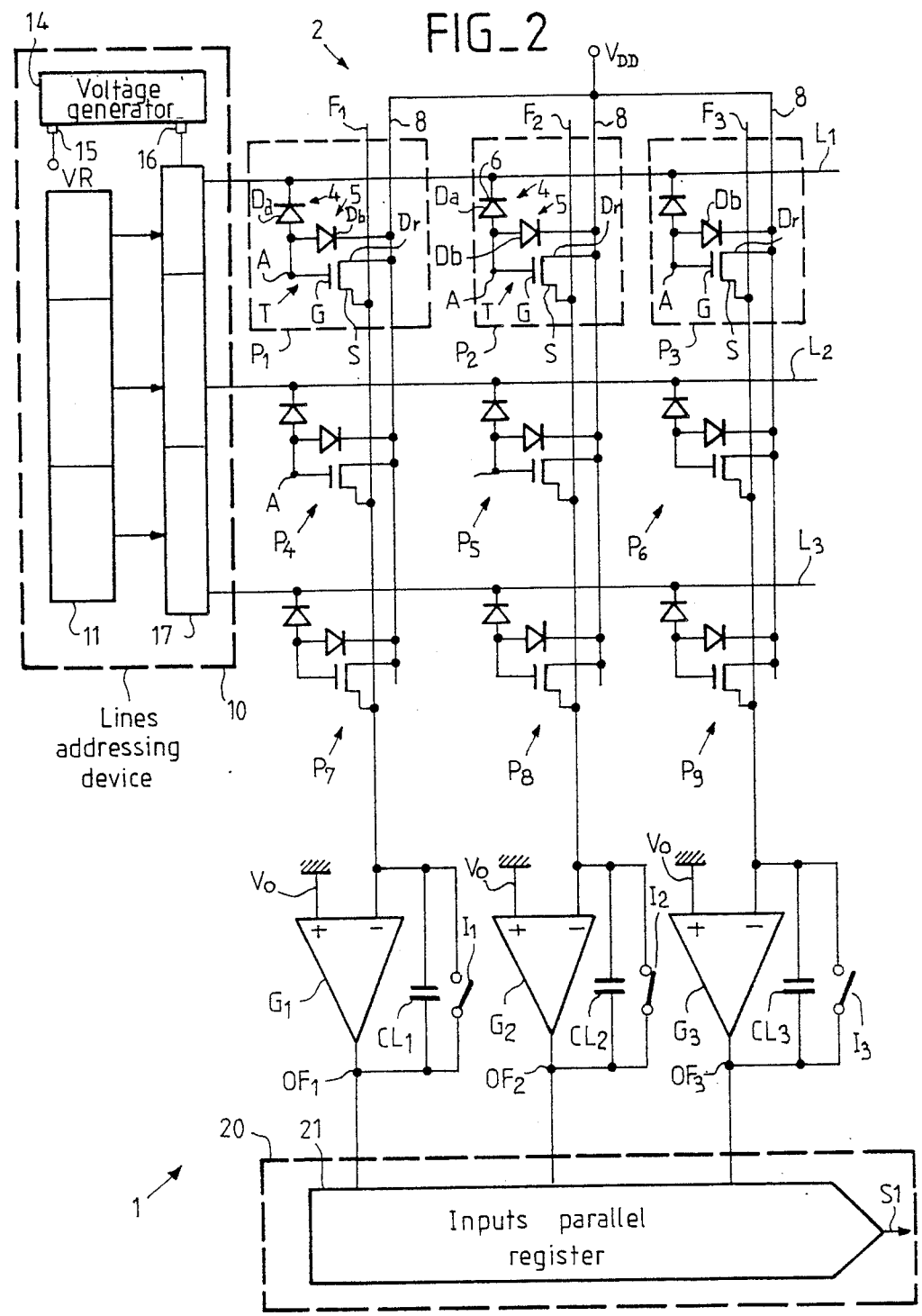

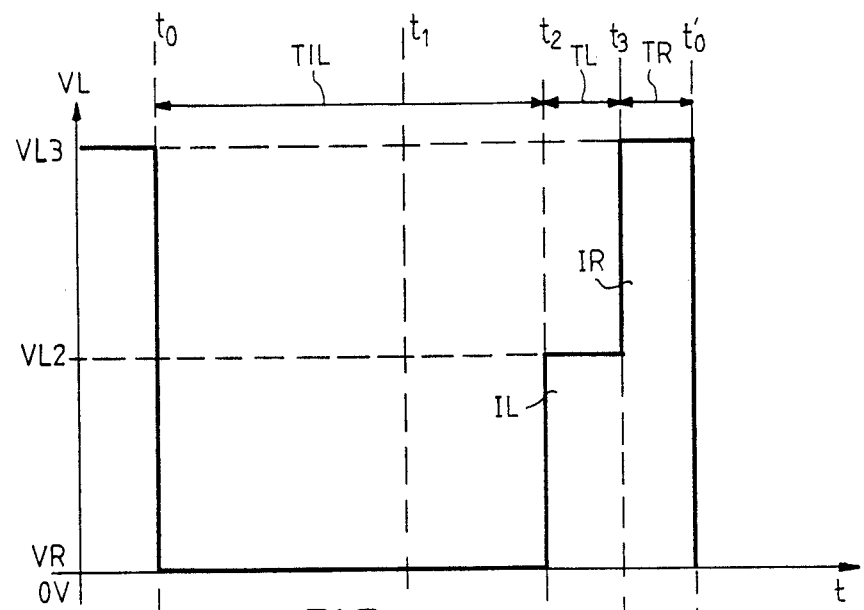
FIG_4-a
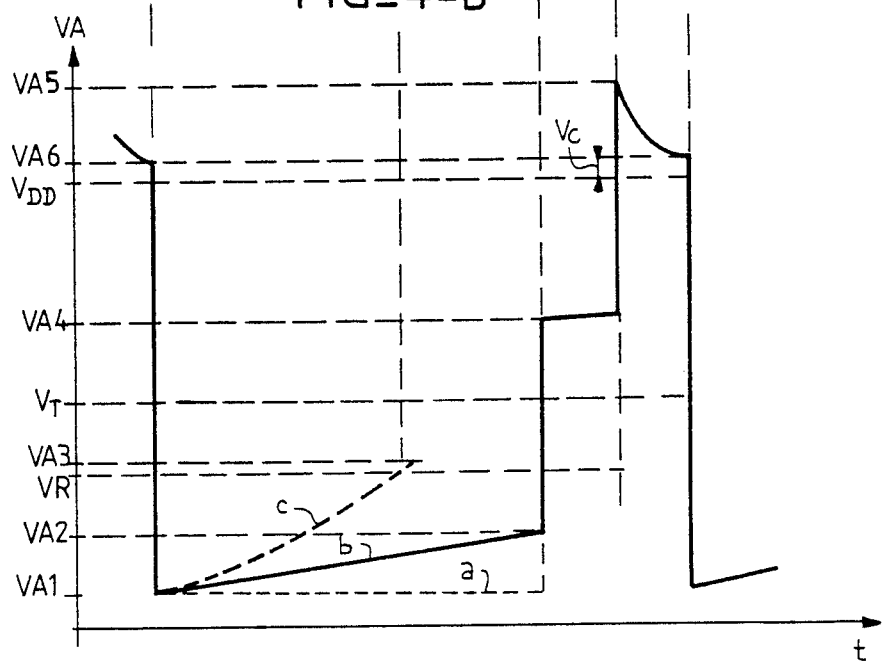
FIG_4-b

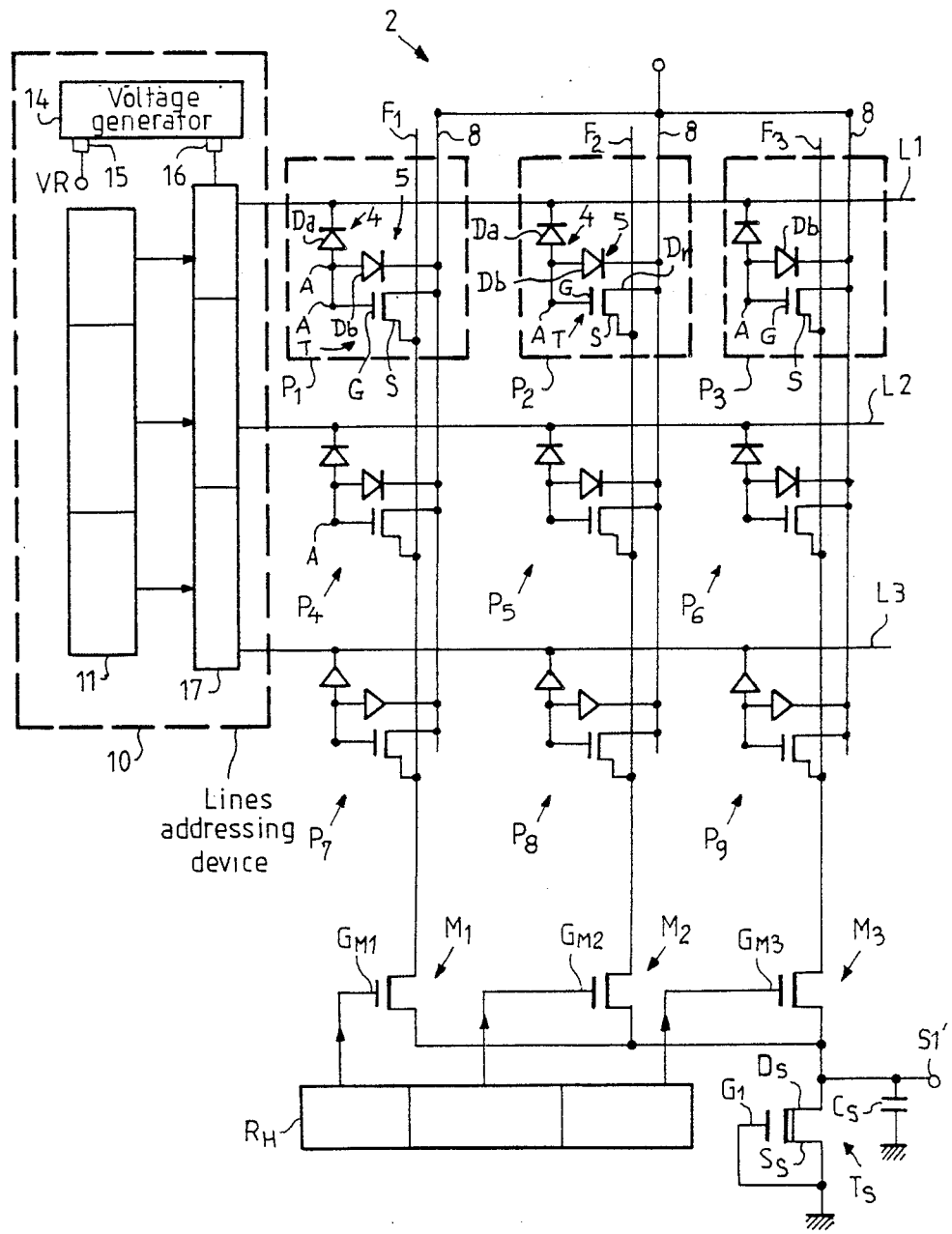
FIG_5

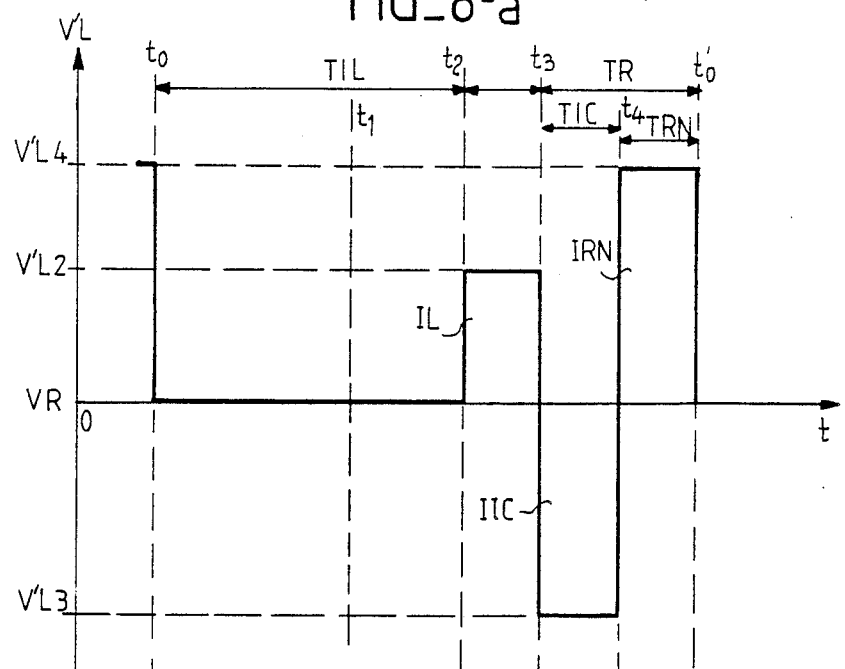
FIG_8-a
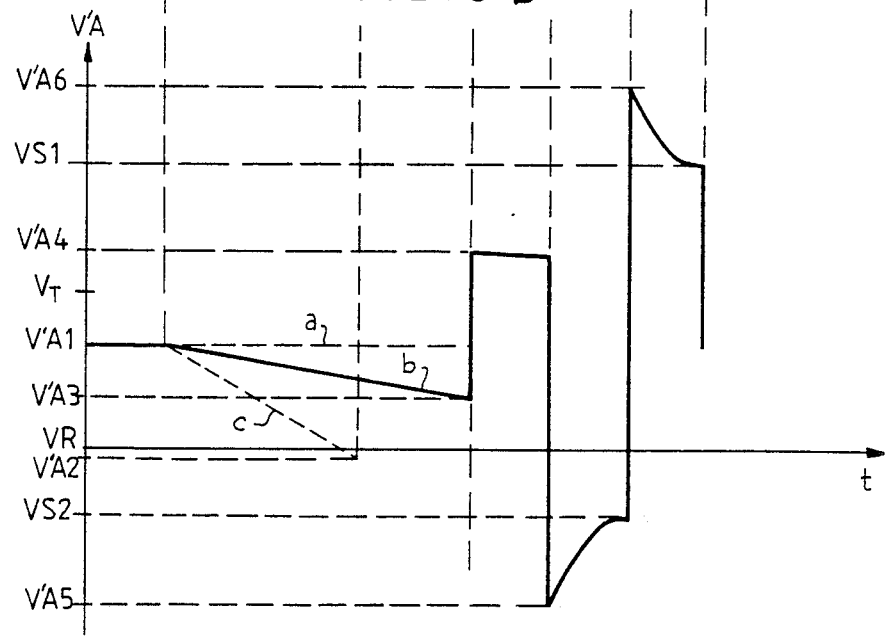
FIG_8-b

FIG_9
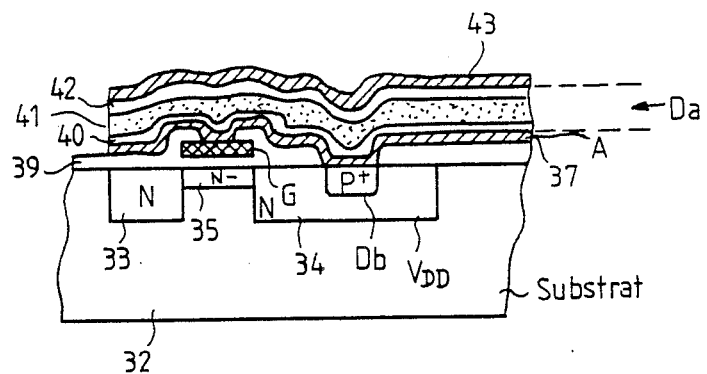
FIG_10
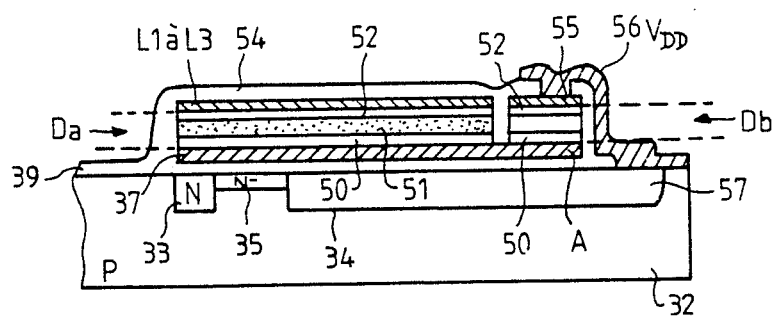

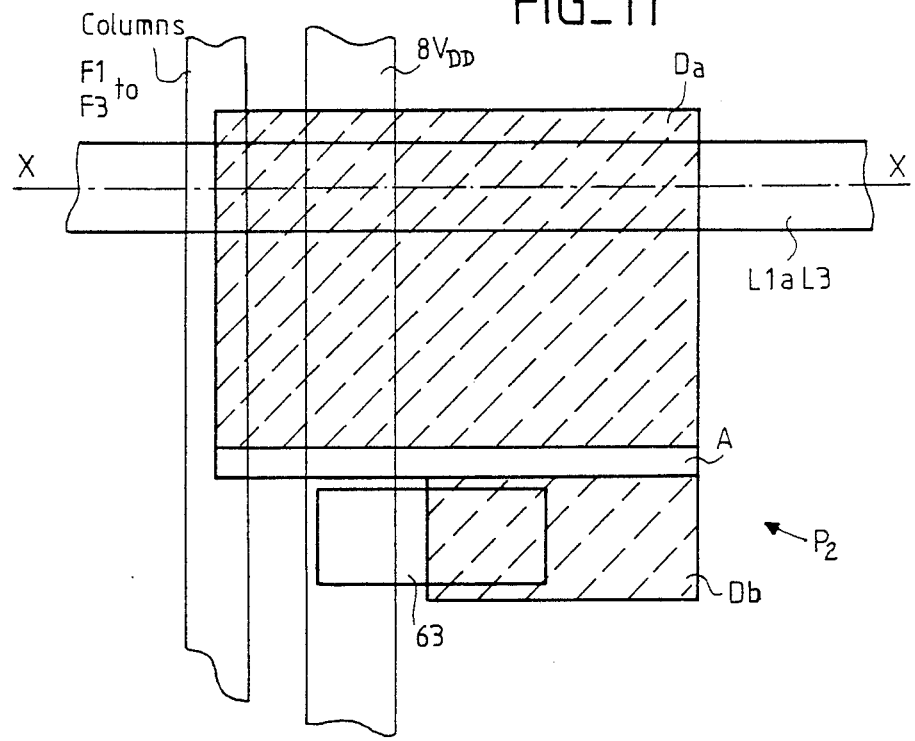
FIG_11
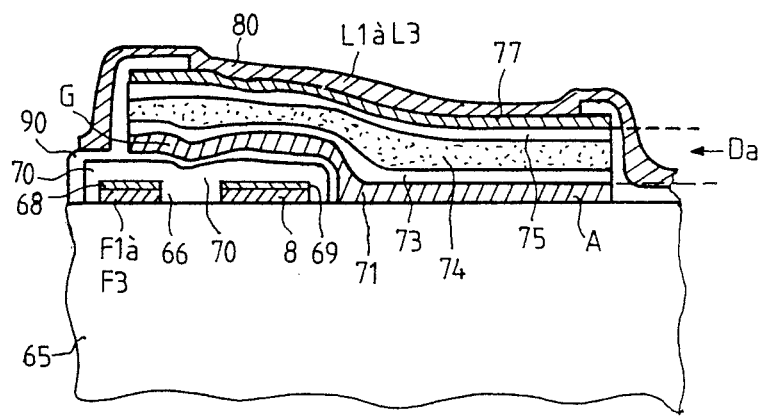
FIG_12

PHOTOSENSITIVE DEVICE OF THE TYPE WITH AMPLIFICATION OF THE SIGNAL AT THE PHOTOSENSITIVE DOTS

BACKGROUND OF THE INVENTION

1. Field of the Invention

The invention concerns a photosensitive device of the solid state type in which a signal amplification is achieved at the level of the photosensitive dots. The invention concerns, in particular, a new arrangement of the photosensitive dots, making it possible both to increase the operating qualities of these photosensitive dots and to broaden the scope of their use.

2. Description of the Prior Art

It is common practice to use photosensitive cells in solid state photosensitive devices wherein these photosensitive cells are placed so as to form a linear detector or array or else are placed in a matrix arrangement and form a photosensitive matrix. A photosensitive matrix has a system of conductors in rows and a system of conductors in columns. At each intersection between a row conductor and a column conductor, there is a photosensitive assembly or photosensitive cell hereinafter called a photosensitive dot. The photosensitive dots are thus organized in both rows and columns. According to a standard configuration, each photosensitive dot is connected between a row conductor and a column conductor.

Each photosensitive dot has at least one photosensitive element such as, for example, a photodiode or phototransistor, sensitive to the visible or near visible light photons. The light photons are converted into electrical charges which get collected in an electrical capacitor. This capacitor forms a storage capacity which may be formed either by the capacitor of the photosensitive dot itself or by an associated ancillary capacitor. A reading device can be used to interrogate the electrical state of the storage capacity, and to convey the electrical charge forming the signal towards a signal amplifier.

In the most standard configuration, a photosensitive dot is formed by a photosensitive element, a photodiode for example, series mounted with a transistor of the MOS type for example which fulfils solely a switch function.

FIG. 1 shows the drawing of a dot of a matrix of photosensitive dots of the prior act. This matrix has a number of rows and columns, and each photosensitive dot Pij is localized at the intersection of an order i row Li and an order j column Cj.

The row Li takes the form of a horizontally oriented row conductor, and the column Cj takes the form of a vertically oriented conductor Cj. The photosensitive dot has a photodiode Dij which is connected to the column conductor by a transistor Tij of the MOS type for example: in this example, the cathode of the photodiode is connected to the ground, and its anode is connected to the drain of the transistor, the source of which is connected to the column conductor, the gate of the transistor being connected to the row conductor. The light is picked up by the photodiode which is periodically pre-charged, and read by means of the transistor. The selection or addressing of the selected row is done by a pulse applied to this row and, hence, to the gate of the transistor so as to make it "on". Subsequently, the signal flows (in the form of charges) in the column conductor, and this signal is integrated in an integrating amplifier Aj.

With a view to simplifying the fabrication of solid state photosensitive matrices, a known way to fulfil the above-mentioned switch function is to use a diode that is series mounted with the photosensitive element as described, notably, in a French patent application No. 86 14058, publication No. 2 605 166, filed on 9th Oct. 1986 on behalf of THOMAS-CSF. This patent application describes solid state photosensitive devices wherein each photosensitive dot is formed by two diodes, mounted in series and upside down with respect to each other, i.e. with opposite directions of conduction. A first diode is connected to a row conductor, and the second diode is connected to a column conductor. This patent application further describes a method for the fabrication of this photosensitive device and a reading method that enables one of the two diodes to work as a "closed" switch when the row to be read is addressed, and thus enables the passage of the electrical charge forming the signal towards the signal amplifier.

One of the main problems raised by the reading of these types of photosensitive dots lies in an excessively great value of their electrical capacitance. This capacitance of each photosensitive element is applied to the column conductor and to the reading amplifier to which this element is connected, and tends to cause deterioration in the signal-to-noise ratio.

Another drawback displayed also by photosensitive dots of this type is known as "smearing", that is the cross-interference that exists between the signal coming from the photosensitive dot connected to a given column electrode, and the signals of all the other photosensitive dots connected to the same column electrode.

To improve the performance characteristics of these photosensitive devices, new structures of the photosensitive dot has recently been proposed, wherein the photocharges collected are not read directly but modulate a voltage or current. It is assumed, in this case, that there is an amplification of the signal at the level of the photosensitive dot itself.

As embodiment of this latter type of photosensitive dot is known from the IEEE publication "Transactions on Electron Devices", vol. 35, No. 5, May 1988, pp. 646 to 652. In this embodiment, the detection and the amplification are provided by a junction field effect transistor (J FET).

Another embodiment is known from the IEDM publication "Tech. Dig.", December 1986, pp. 353 to 356. The assembly described in this publication uses a transistor that is common to the amplification function and to the detection function. This transistor is of a type similar to a MOS transistor although, with respect to this transistor, it has differences made to it so that it can, notably, fulfil a detector function.

These two embodiments have, inter alia, the following defects:

(a) for the embodiment using a J FET transistor:

the technology of the J FET is relatively complicated and, therefore, expensive. It cannot be implemented in the context of a thin film type of technology.

it calls for the use of monocrystalline silicon so that, with respect to assemblies enabling the use of amorphous silicon, an embodiment of photosensitive dots such as this further has the drawback wherein it is not possible to make a large-area photosensitive device that can be used notably for the detection of X-ray images where it is particularly useful to have a large-area surface-image detector, 40 cm by 40 cm for example (it is known that for the detection of radiological images, it is enough to add a scintillator screen to a photosensitive matrix to convert X-rays into photons).

(b) For the second embodiment, which uses a transistor of a type resembling a MOS transistor:

this embodiment has the same defects as the above-mentioned ones, namely: complicated technology, the obligatory use of monocrystalline silicon which leads to the same drawbacks as the above-mentioned ones. And it would appear, furthermore, that this second embodiment has the drawback of not being protected against the smearing effect.

SUMMARY OF THE INVENTION

The present invention concerns a solid-state type of device, the photosensitive dots of which are arranged in a novel way enabling an amplification of the signal at each photosensitive dot without showing the above-mentioned drawbacks, and further making it possible to obtain a reduction of the dark current as well as a better quantum yield.

The present invention proposes a new scheme for a photosensitive dot of the type comprising an amplification transistor, said scheme being applicable advantageously both to linear array type photosensitive devices and to surface type devices with average or small areas using monocrystalline silicon for the amplification transistor or again, to large-area photosensitive devices using amorphous silicon for the fabrication, inter alia, of the amplification transistor located at the level of each photosensitive dot.

According to the invention, there is proposed a photosensitive device comprising at least one row conductor intersected with at least one column conductor, a photosensitive dot being formed substantially at each intersection between a row conductor and a column conductor, the photosensitive dot comprising at least one first dipole element and one second dipole element, mounted in series, at least one of which is a photosensitive element, the meeting point or zone of the two dipoles forming a point at floating potential at which there are stored electrical charges generated by an exposure to light of the photosensitive dot, the first dipole being, furthermore, connected to a row conductor by its end or pole opposite to the point at floating potential, a device further comprising a tripole element of the transistor type, a first pole of which forms the control gate, said control gate being connected to the point at floating potential, a second pole of the transistor being connected to the column conductor, the third pole of the transistor being connected, at the same time, on the one hand to a supply voltage and, on the other hand, to the second dipole by a pole or end of the latter, opposite the point at floating potential.

BRIEF DESCRIPTION OF THE DRAWINGS

The invention will be better understood from the following drawings, given as a non-restrictive example and made with reference to the twelve appended drawings, of which:

FIG. 1, already described, shows the diagram of a photosensitive dot according to the prior art;

FIG. 2 shows a non-restrictive example of the the diagram of a photosensitive device having a photosensitive matrix formed by photosensitive dots according to the invention;

FIG. 3 shows the electrical diagram of a variant of a photosensitive dot according to the invention;

FIGS. 4a, 4b are timing diagrams illustrating the working of the photosensitive matrix;

FIG. 5 is an electrical diagram showing the photosensitive device in a same way as in FIG. 2, except for the reading means which are organized differently;

FIG. 6 shows a voltage/current curve of a diode with two conduction thresholds;

FIG. 7 shows the electrical diagram of a photosensitive dot comprising a diode having the characteristics shown in FIG. 6;

FIGS. 8a, 8b are timing diagrams that illustrate the functioning of photosensitive dots as shown in FIG. 7;

FIG. 9 gives a schematic view of a structure of a photosensitive dot using an amplification transistor of the integrated circuit type, and a photosensitive diode made of amorphous silicon;

FIG. 10 gives a schematic view of a structure of a photosensitive dot using an amplification transistor of the integrated circuit type, where the two diodes shown in FIG. 2 are made of amorphous silicon;

FIGS. 11 and 12 give a schematic view of an example of a structure wherein the amplification transistor of a photosensitive dot is made of amorphous silicon, FIG. 11 being a top view of this structure and FIG. 12 being a sectional view.

DESCRIPTION OF THE PREFERRED EMBODIMENTS

FIG. 2 shows the electrical diagram of a photosensitive device 1 having a matrix 2 of photosensitive dots P1, P2 ... P9. In the non-restrictive example described, the number of photosensitive dots P1 to P9 is restricted to 9 according to a 3×3 matrix assembly, in order to simplify FIG. 2. The matrix 2 includes row conductors L1 to L3 and column conductors F1 to F3, the number of each type of these conductors being limited to 3, in view of the example of FIG. 2 where only 9 photosensitive dots P1 to P9 are shown. However, in the spirit of the invention, this matrix assembly may have a far greater capacity, of several millions of dots for example, in using, for example, 2,000 row conductors and 2,000 column conductors so as to obtain a surface detector with dimensions of the order, notably, of 40 cm by 40 cm.

In practice, and in a manner which is standard, the photosensitive dots P1 and P9 are each formed at the intersection of a row conductor L1 to L3 and a column conductor F1 top F3.

According to a characteristic of the invention, each photosensitive dot P1 to P9 has two dipole elements, at least one of which is a photosensitive element, and comprises a tripole element formed by a transistor T. In taking, for example, the second photosensitive dot P2, the material structure of which is achieved substantially at the intersection between the first row conductor L1 and the second column conductor F2, each photosensitive dot P1 to P9 has a first dipole element 4 series mounted with a second dipole element 5. The meeting point or zone between the two dipole elements 4, 5 forms a point at floating potential A. As indicated earlier, either of the two dipole elements 4, 5 or both of them together are photosensitive.

In a first version of the invention, the two dipole elements 4, 5 are formed by diodes, Da and Db respectively, of which at least one, the first diode Da for example, is a photodiode. The first diode Da is preferably made so as to have a greater area than the second diode Db, 10 times greater for example, so that the capacitances (not shown) of these diodes Da, Db when they are reverse biased is such that the capacitance of the first diode Da is greater than that of the second diode Db. It must be further noted that, in the example of this first configuration, the two diodes Da, Db are placed in series and upside down with respect to each other, i.e. with opposite directions of conduction. In the non-restrictive example described, the main function of of the first diode Da is photodetection, and the second diode Db is designed to restore the potential at the point at floating potential A, at which there are stored electrical charges generated during the exposure of the photosensitive dot P2 to a radiation of visible or near visible light (not shown). Of course, if the second diode Db were also to be a photodiode, photocharges generated by it would also be stored at the point at floating potential A. A pole 6 of the first dipole 4, opposite the point at floating potential A, namely in this example the cathode of the first diode Da, is connected to the first conductor L1. And the cathode 7 of the second diode Db is connected to a supply conductor 8 to which there is applied a supply voltage $V_{DD}$. Of course, the two diodes Da, Db could be mounted with different directions of conduction provided, for example, that there is a reversal of the voltage biases and the read pulse biases as shall be explained more clearly hereinafter.

In the non-restrictive example of FIG. 2, the tripole T is shown as being a MOS type transistor with N channel example, but the T transistor could also be a junction field effect transistor and, in either of these two types, it could equally well be of the integrated circuit type or of the thin film transistor type, i.e. of the type using monocrystalline silicon, as much as of the type capable of using amorphous silicon with, in the latter case, the advantage that it can be easily made with a large area. It should be also be noted that the transistor T could be a bipolar type of transistor.

The first function of the transistor T, during the reading of the photosensitive dot P2, is to amplify the useful signal formed by charges stored at the point at floating potential A. Its second function is to apply the useful signal that it has amplified to the column conductor to which it is connected. To this end, the control gate G of the transistor T (said gate G forming a first pole of the triple T) is connected to the point at floating potential A. Furthermore, the drain Dr of the transistor T (said drain Dr forming a second pole of the tripole) is connected to the supply conductor 8, that is, it is connected to the same supply voltage as the cathode 7 of the second diode Db. Finally, the source S of the transistor T (said source S forming the third pole of the tripole T) is connected to the column conductor F2.

Each photosensitive dot P1 to P9 is formed in the same way as the second photosensitive dot that has just been described.

In a manner that is standard per se, the row conductors L1 to L3 are connected to a row addressing device 10 comprising notably a logic shift register 11 that provides for the sequential addressing of each row L1 to L3 with a view to the reading at the photosensitive dots P1 to P9 which are connected to this row. The register 11 controls the application of a voltage VL the form of pulses called a reading pulse IL and a restoring pulse IR (not shown in FIG. 2), from row conductors to row conductors, while the other non-addressed row conductors are kept at a rest potential VR, the reference potential VR being negative with respect to the direct supply voltage $V_{DD}$. The pulses IL, IR are given by a voltage pulse generator 14, one output 15 of which is connected to the rest voltage VR and a second output 16 of which is connected to a gate device 17 by means of which the pulses IL, IR are applied to the row conductors L1 to L3 under the control of the shift register 11.

Furthermore, in one embodiment indicated as a non-restrictive example, each column conductor F1 to F3 is connected to the negative input "−" of an operational amplifier G1 to G3 mounted as an integrator, by means of an integration capacitor CL1 to CL3. Each integration capacitor is mounted between the negative input "−" of the amplifier G1 to G3, and the output OF1, OF2, OF3 of this amplifier. The second input or positive "+" of each amplifier G1 to G3 is connected to a column reference potential Vo which imposes this reference potential on each column conductor F1 to F3 and, consequently, on each source S of each transistor T. In the non-restrictive example described, this reference potential Vo is the ground or zero volts, and it may be the same as the rest voltage VR of the row addressing device.

Each integrator amplifier G1 to G3 includes a resetting switch I1 to I3, mounted in parallel with the integration capacitor CL1 to CL3. In FIG. 2, the switches I1 to I3 are depicted as switches but it is clear that, in a standard way, they may consist of transistors, of the MOS type for example, controlled by resetting signals (not shown).

The outputs OF1 to OF3 of the amplifier G1 to G3 are connected to reading and multiplexing means 20 comprising, for example, an analog data acquisition device 21, formed by a parallel inputs and serial output (S1) shift register of the CCD (charge-coupled device) type, for example. Thus, in a standard way, the analog data acquisition device can serially put out signals (not shown) that correspond to the charges that have been integrated by the amplifiers G1 to G3, in the stage for reading all the photosensitive dots connected to one and the same row conductor L1 to L3. Of course, in a manner that is also standard, it is possible to achieve a multiplexing of the column conductors so as not to use one integrator amplifier per column conductor. In this case, several successive column conductors are connected, successively in time, to one and the same integrator amplifier by means of a multiplexing circuit as described in French patent applications filed on behalf of Thomson-CSF on 20th Jan. 1986 under No. 86.00716 and on 30th Apr. 1986 under No. 86.00334. These patent applications relate to solid state photosensitive matrices and further describe the organization of row addressing means, as well as methods for the control and making of these matrices.

It has to be noted that, in the spirit of the invention, the photosensitive dots P1 to P9 can be made in a manner different from that of the example of FIG. 2.

FIG. 3 shows, as a non-restrictive example, the electrical diagram of a second version of the photosensitive dots P1 to P9. To simplify the description, the example of FIG. 3 is restricted to the representation of the second photosensitive dot P2 which is placed at the intersection the first row conductor L1 and the second column conductor F2.

For this version, the first dipole 4 is formed by an insulating capacitor Ci, that is, as compared with FIG. 2, the first diode Da is replaced by a capacitor. The insulating capacitor Ci may be a standard capacitor. In this case, the second diode Db fulfils the dual function of a photodetection element and a switch-over element or switch to restore the potential at the point at floating potential A. The insulating capcitor Ci then has the sole function of insulating, in dc mode, the point at floating potential A. However, the insulating capacitor Ci may also have a photoconductor of high resistivity as a dielectric, for example an intrinsic amorphous silicon. In this case, the photodetection may be provided solely by the insulating capacitor Ci or provided both by this capacitor and by the second diode Db.

The equivalent electrical diagram (not shown) of the insulating capacitor Ci, should the latter comprise a dielectric formed by a photoconductive material of high resistivity, such as intrinsic amorphous silicon for example, corresponds to the capacitor Ci with, in parallel on this capacitor, a variable electrical resistor, the value of which diminishes when the capacitor Ci is exposed to light.

FIGS. 4a, 4b represent timing diagrams that make it possible to illustrate the operation in the case where the photosensitive dots P1 to P9 are formed according to the example of FIG. 2, where they comprise two series-mounted diodes Da, Db. Hereinafter, we shall consider solely the second photosensitive dot P2, as an example valid for all the photosensitive dots connected to one and the same row conductor. The variations of the row potential VL, applied to the first conductor L1, are represented in the diagram 4a. The variations in potential VA at the point at floating potential A are represented in the diagram 4b. The periodic operation cycle is between an instant t0 and and instant t'0.

At the outset, the instant t0 corresponds to the end of a preceding cycle and to the start of a light integration stage TIL of a new cycle. At this instant, the potential VL applied to the first row conductor L1 has a positive value with respect to the rest voltage VR at 0 volts for example, and this potential goes to the value of the rest voltage VR.

Just before the instant t0, the two diodes Da, Db are reverse biased and, consequently, they behave like capacitors. Since the capacitance of the first diode Da is far greater (about ten times greater) than the capacitance of the second diode Db, the negative variation of the voltage VL is transmitted to the point A and the voltage VA, at this point, goes to a value VA1 that is smaller than the rest voltage VR, i.e., negative with respect to the latter. Consequently, from the instant t0 onwards, the first diode Da is reverse biased, and can store the light information formed by electrical charges, in the form of positive carriers (holes) which have collected at the point at floating potential A throughout the light integration period TIL. The photoelectrons are removed by the potential VL if they come from the first electrode Da, or by the supply $V_{DD}$ if they come from the second diode Db. During the light integration period TIL, all the other row conductors of the photosensitive matrix may be successively addressed and, firstly, all the photosensitive dots that are connected to them may be read and, secondly, the potentials of the points A of the floating potentials may be reset or restored.

It must be noted that, at the instant t0, the value VA1 of voltage VA at the point A should entirely switch off the transistor T: in effect, the control gate G of this transistor T is connected to the point at floating potential A, i.e. to the voltage VA, and the voltage applied to the source So of the transistor T is fixed at the reference value applied to the positive inputs "+" of the integrating amplifiers G1 to G3. Thus, depending on whether the MOS transistor T is of the enhancement-mode or depletion-mode N channel type, the following conditions suffice to turn it off completely: in the former case, its control gate G should be at the same potential as its source S and, in the latter case, its control gate G should be at a potential that is largely negative with respect to the source S to turn the transistor T off. Of course, should the control gate G be largely negative with respect to the source S of the transistor T, the positive inputs "+" of the integrator amplifiers G1 to G3 may be connected to a reference potential Vo that is positive with respect to the rest voltage VR. In the non-restrictive example described, it is assumed that a threshold voltage $V_T$, starting from which the transistor T is conductive, is positive with respect to the rest voltage VR, and that this rest voltage VR has one and the same value (zero volts or ground) as the reference voltage Vo.

With the exposure of the photosensitive dot P2 from the instant to onwards, the voltage VA at the point A tends to become more positive. FIG. 4b shows different possible changes in the voltage VA during the light integration stage TIL:

the curve referenced a (in dashes) represents an absence of illumination and, in this case, the voltage VA preserves one and the same value VA1 until the end of the integration stage TIL, the dark currents having been overlooked;

the curve in a solid line, referenced b, represents a mean illumination, below saturation. In this case, and assuming that the intensity of the illumination is constant, the voltage VA gradually changes from the value VA1 to a more positive value VA2, which is reached at the end of the integration stage TIL;

the curve in dashes, referenced c, represents an illumination above saturation. In this case, the voltage VA increases far more quickly than in the case of the curve b to reach, at an instant t1, a value VA3 that corresponds to the saturation and is more positive than the rest voltage VR. Consequently, for this case, the first diode Da goes into forward bias, thus enabling the recombination of the excess carriers and thus providing for the anti-dazzle function of the device. For accurate functioning of this device, it is seen that it is necessary for the rest voltage VR to be sufficiently smaller than the threshold voltage VT of the transistor T to prevent the latter from being made conductive.

It has to be noted that, throughout the operating cycle, the possibility of reaching the so-called saturation value corresponds to the only period during which the first diode Da may possibly go into forward bias and that, throughout the rest of the cycle, it is reverse biased and therefore behaves like a capacitor. Thus, the operation that is described with reference to FIGS. 4a and 4b can be applied also to the version of the photosensitive dot shown in FIG. 3 where the dipole element 4 is formed by an insulating capacity Ci. It has to be noted, however, that the anti-dazzle function in the case of the photosensitive dot shown in FIG. 3, is advantageously provided if the dielectric of the insulating capacitor Ci is a photoconducting dielectric. In effect, in this case, when the voltage VA approaches the rest voltage VR, the electrical field between the plates of the capacitor Ci, and hence in the conductive material, diminishes thus reducing the photodetection until it is cancelled for a null field when the voltage VA is equal to the voltage VR at very high illumination levels. A dynamic range compression effect is also obtained, with the photosensitivity diminishing with the increase in the illumination.

At the end of the integration stage TIL, at an instant t2 when a reading stage TL begins, the row voltage VL goes to a value VL2 which is positive with respect to the preceding value VR and smaller than the supply voltage $V_{DD}$, while the rest potential VR is maintained on all the other non-addressed row conductors. This variation of the voltage VL from the value VR to the value VL2 forms the front edge of a reading pulse IL.

If we consider the case illustrated by the curve referenced b of a mean illumination (the operation in the case of the curves identified a and c are deduced without difficulty), at the instant t2, the rising edge of the reading pulse IL is transmitted to the point at floating potential A by the capacitor formed by the first diode Da, the latter being reverse biased. The voltage VA then goes from the value VA2 to a value VA4 which is greater than the threshold voltage VT of the transistor T. This makes the transistor T conductive, thus enabling the collecting, at the column F2, of a useful signal amplified in current by the transistor T, which is proportionate to the signal stored at the point at floating potential A. The amplified useful signal injected into the column conductor F2 is applied to the integrator amplifier G2 in a manner that is standard per se, and it has to be noted that the resetting switch I2 is kept in the "closed" state to short circuit the integration capacitor CL2 throughout the cycle of operation with the exception of the reading stage TL when this switch I2 is put into the "open" state.

It must be noted that, in the case of the assembly shown in FIG. 2, the transistor T gives an amplification in current but that it is possible to use other assemblies that enable an amplification in voltage to be obtained, as shall be described after the present explanation relating to the operation.

It is important to note that, in all cases, the reading is non-destructive: the signal remains stored at the point at floating potential A and, if necessary, several successive readings are possible, if several reading pulses IL are made to succeed one another. The end of a reading pulse has to be, in this case, formed by a variation in the row voltage VL from the value VL2 to the rest value VR.

In the non-restrictive example described, a single reading is done and the reading pulse IL is followed by a restoring pulse IR so that it is not necessary to bring the row voltage VL back to the value of the rest voltage VR. The stage for restoring the potential VR of the point at floating potential A immediately follows the reading stage TL, and the restoring pulse IR has a positive amplitude that is greater than the reading pulse IL. At the instant t3, the front edge of the restoring pulse IR takes the row voltage VL to a value VL3, and the variation between the values VL2 and VL3 is transmitted to the point A by the capacitance presented by the first diode Da. The voltage VA at the point A then increases and goes from the value VA4 to a value VA5 that is far greater than the value of the supply voltage $V_{DD}$. In fact, the value VL3 of the row voltage VL is chosen so that, if possible, the value VA5 of the voltage VA is far greater than the supply voltage $V_{DD}$ to which we add the conduction threshold voltage or characteristic curve flexion point voltage $V_C$ of the second diode Db which is the potential restoring diode. In this configuration, at the instant t3, with the voltage VA at the point A having the value VA5, the second diode Da goes into forward bias, so that this second diode discharges the point at floating potential A up to a value VA6 formed by the value of the supply voltage $V_{DD}$ to which the flexion point voltage $V_C$ of the second diode Db is added. The result thereof is that the photocarriers stored at the point at floating potential A are thus discharged on to the voltage $V_{DD}$ connection. The row voltage VL is then brought back to the rest voltage VR at an instant t'0 which corresponds to the end of the restoration stage TR and marks the start of a new light integration stage TIL for this row, whereas the reading and restoring pulses IL, IR may then be applied to a following row conductor.

It has to be noted that, during the reading stage TL, only the transistor T of the second photosensitive dot P2, belonging to the selected row conductor, that is, to the first row conductor L1, puts through a current on the column F2, all the other transistors of the same column being kept off by the level of the row voltage VL applied to the other row conductors. Nevertheless it is possible, if need be, to turn on any one of the other transistors, that is, other row conductors to enable a simultaneous reading of two or more dots of the column: the currents are then summated in the case of a reading in current mode.

FIG. 5 shows, by way of a non-restrictive example, a photosensitive device that differs from the one shown in FIG. 2 solely as regards the elements used for the reading of the photosensitive dots P1 to P9. In the non-restrictive example shown in FIG. 5, this reading is a reading in voltage mode for which a depletion-mode MOS type, saturation biased transistor TS is used. The gate G1 and the source $S_s$ of this transistor are connected to each other and to the ground or reference voltage Vo. And each of the column conductors F1 to F3 is connected to a switch-over element M1, M2, M3 by means of which it is connected to the drain $D_s$ of the transistor TS. A capacitor $C_s$ is mounted between the drain $D_s$ and the ground or reference voltage Vo. The switch-over elements M1, M2, M3 may be MOS transistors, respectively connected by their drain to the first, second and third column conductors F1, F2, F3, and having their sources connected to one another and to the drain $D_s$ of the output transistor TS. Each control gate GM1, GM2, GM3 of the switch-over elements M1, M2, M3 is connected to an output 30, 31, 32 of a horizontal register $R_H$ formed by a standard shift register and sequentially controlling the conduction of the switch-over elements M1 to M3. The reading is a reading in voltage, the time needed for this reading may be very short, and it is thus possible to sequentially connect all the column conductors F1 to F3 during the period of the reading stage T1.

When a column connector F1 to F3 is connected to the transistor TS, the set formed by the amplifier transistor T and the output transistor TS forms a voltage follower which copies, at the drain $D_s$, the voltage VA existing at the point at floating potential A. There is a very high gain the reading of the signal charge for the capacitance $C_s$ is far greater than the capacitance $C_A$ (not shown) present at the point at floating potential A, the gain being equal to the ratio $C_s/C_A$. The drain $D_s$ of the output transistor TS forms an output S1' which can be applied to a standard acquisition device (not shown) to store and process results.

It has to be noted that, even to obtain a high efficiency of reading of the photosensitive dots, even at the low light level, there is a problem that is common to all the structures of photosensitive dots wherein a diode is in series with the point at floating potential at which the charges are stored. This problem arises from the fact, notably, that at the low light levels, the point at floating potential A where the charges are stored undergoes a low variation in potential: consequently, the voltage pulses that are applied to the point at floating potential and get superimposed on the potential existing at this point do not enable the diode to be forward biased beyond its conduction threshold to an extent sufficient for this diode to display a dynamic resistance that is low enough to let the stored charges flow away. One of the drawbacks resulting therefrom is that the charges which have not flowed away remain at the point at floating potential and are added to the charges generated by the light integration of the following cycle: each measurement thus preserves the memory of the preceding measurement (remanence phenomenon) and an error in reading results therefrom. Thus taking, for example, the diagram of FIG. 4b, it is necessary for the voltage VA5 at the instant t3 of the start of the restoring phase TR to have a sufficiently high value for the difference in potential $VA5-V_{DD}$ developed at the terminals of the second diode Db to go far beyond the value of the conduction threshold or flexion point voltage $V_C$ of this diode which thus shows a resistance, in dc mode, that is low enough to make all the charges that were stored at the floating point A flow away, in doing so in a period of time that is smaller than the duration of the restoring stages TR. Consequently, at the start of each new light integration stage, the potential of the floating point A still has the same value.

The above-mention defect may be overcome by introducing a quantity of additional charges called driving charges. Different methods may be used to introduce this quantity of additional charges, such as the methods taught, for example, in a French patent application No. 86 00656 on behalf of THOMSON-CSF wherein this additional charge is called a "charge base or bias charge". The simplest method consists in producing an additional illumination which gets added to the illumination produced by the useful light signal. This approach has the drawback, notably, of necessitating an additional source of illumination, and of being, on the electrical level, a source of noise during the reading.

With the photosensitive dots P1 to P9 according to the invention it is possible, in a simple way, to achieve an accurate resetting or restoring of the point at floating potential A after each reading stage, without requiring any additional source of light, but in replacing the second diode Db, which fulfils a switch-over function for the restoration, by a switch-over element having a characteristic curve with two thresholds. Thus, in this version of the invention, the second diode Db, called the restoring diode, is replaced by a diode which may be made conductive in forward bias if a forward bias voltage at its terminals becomes greater than a first threshold voltage Vs1, and which can be made conductive in reverse bias if a reverse bias voltage becomes greater than a second voltage threshold Vs2. Under these conditions, the second diode or restoring diode, referenced Dbz, has a current/voltage characteristic curve of the type shown in FIG. 6, similar to that of a zener diode. It has to be noted that, in this case, the second diode Dbz, which is a restoring diode, forms a capacitor when it is not conductive. The capacitance value of this capacitor, as in the preceding case, is smaller than the capacitance of the first dipole 4 (the first diode Da in the example).

Thus, for example, it is possible to make diodes of this kind, which are made conductive in forward bias for a first positive voltage threshold of about +1 volt, and which are made conductive in reverse bias for a second negative voltage threshold which may be, for example, between $-2$ volts and $-15$ volts, hence adjustable by an appropriate choice.

FIG. 7 shows, as a non-restrictive example, an electrical diagram of a photosensitive dot, the second photosensitive dot P2 for example, in a version where the second diode or restoring diode referenced Dbz is of the type with the characteristic curve shown in FIG. 6, that is, with a first threshold of conduction in forward bias Vs1 and a second threshold of conduction in reverse bias Vs2. As compared with the electrical diagram of the photosensitive dot of FIG. 2, for example, the difference lies in the fact that the restoring diode Dbz is of the type having two thresholds of conduction as mentioned above. Secondly, FIG. 7 illustrates the fact that the direction of assembly of the first diode Da can be modified, this diode being connected, in FIG. 7, to the first row conductor L1 by its anode, and to the point at floating potential A by its cathode, the anode of the restoring diode Dbz being also connected to the point at floating potential A.

It is clear that, in this configuration, the charges stored at the point at floating potential A are electrons so that, with exposure to light, the voltage VA of the point at floating potential A tends towards negative potentials, unlike the example shown in FIG. 4b.

FIG. 8a represents variations in the row potential V'L applied to the row conductor addressed, namely the first row conductor L1 in the example, to which the second photosensitive dot P2 is connected. FIG. 8b represents the variations of the potential V'A at the point at floating potential A.

The instant t0 marks the end of one cycle and the start of a new cycle which starts with a stage of exposure to light, namely a light integration stage TIL.

At the instant t0: the potential applied to the row conductor L1 is brought back to its rest value VR. All the other non-selected row conductors are also at the rest value VR;

at the point at floating potential A, the voltage V'A is at a value V'A1 that results from the end of the proceding cycle. The value VA'1 is smaller than the conduction threshold voltage $V_T$ of the transistor T. Furthermore, the value V'A1 is greater than the rest value VR of the row potential so that the first diode Da is reverse biased. Consequently, it stores charges (electrons) as a function of the intensity of the light to which the photosensitive dot P2 is exposed. As in the example of FIG. 4b, a curve, reference a (in dashes), illustrates the case of a null illumination and, in this case, the voltage V'A keeps the value V'a1 up to end of the light integration stage TIL. Another curve referenced c (in dashes) illustrates the case of a very high light intensity that leads to saturation and, in this case, the potential V'A of the floating point A diminishes in a steep slope and tends towards the negative potentials to reach a value VA'2 at an instant t1, where the first diode Da goes into conduction in forward bias. A case of mean illumination is represented by the curve referenced b (in a solid line): in this case, the voltage V'A diminishes to reach a value V'A3 between the values VR and V'A2.

At the instant t2 starts the reading stage TL, that is, at the instant t2, a reading pulse IL is applied solely to the row conductor L1 addressed (it must be noted that that the resetting switch I2 which works with the integrating amplifier G2 is put into the "open" state only during the reading stage TL). With the rising edge of the positive reading pulse IL, the row potential V'L goes from the rest value VR to a value V'L2 and the variation, namely the difference V'L2−VR, is transmitted essentially to the point at floating potential A. The voltage V'A at the point A goes from the value V'A3 (for the case of the curve 2 of mean illumination) to a value V'A4 which is greater than the conduction threshold V'T of the transistor T, the result of which is a reading of the charge stored at the point A.

The instant t3 corresponds to the end of the reading phase TL and to the start of a charge injection stage TIC which is marked by a negative variation of the row voltage V'L: the row voltage V'L is reduced to the point of becoming negative, for example to a value V'L3. The variation or difference V'L2−V'L3 is transmitted to the point A where the voltage V'A goes to a value V'A5 which is more negative than the reverse conduction threshold Vs2 of the second diode Dbz or restoring diode. This restoring diode is then reverse biased with a voltage difference at its terminals that is great enough for the diode Dbz to then show a low dynamic resistance (the voltage V'L3 should be made sufficiently negative so that even under illumination, the second diode Dbz is biased from the instant t3 onwards in a region where its dynamic resistance is low). The instant T" thus marks the start of a charge injection pulse which lasts until an instant t4, and the sign of which is contrary to that of the read pulse IL. Consequently, starting from the instant t3 onwards, the restoring diode Dbz becomes conductive (in reverse bias) and its internal resistance is low enough to bring the voltage V'A at the point A to the value corresponding to its reverse conduction threshold Vs2 before the instant t4. This corresponds to injecting charges at the floating point A which get added to the charges generated by the illumination, and which enable the potential A to be always brought back to one and the same value which is the reverse conduction threshold Vs2, this being achieved for any intensity of the illumination to which the photosensitive dot has been subjected during the light integration stage.

At the instant t4, the row potential V'L gets inversed to form a pulse IRN which lasts up to an instant t'0 marking the start of a following cycle. At the instant t4, the row potential V'L has passed from the value V'L3 to a more positive value V'L4. Since the first diode Da is reverse biased, it behaves like a capacitor and almost completely transmits the variation V'L4−V'L3, applied to the row potential at the instant t4, to the point at floating potential A. At the floating potential point A, the potential V'A then goes from the reverse conduction threshold value Vs2 to a a value V'A6 which is greater than the forward conduction threshold value Vs1 of the second diode or restoring diode Dbz. Subsequently, this restoring diode Dbz is made conductive in forward bias with a dynamic resistance that is low enough so that, up till the instant t'0, the potential V'A at the point A develops up to the value of the direct conduction threshold Vs1. The condition for the dynamic resistance of the diode to be low in this case is that, at the instant t4, the difference V'L4−V'L3 should be substantially greater than the difference between the forward conduction threshold and reverse conduction threshold voltages Vs1−Vs2, namely V'A6−V'A5 greater than Vs1−Vs2.

The instant t'0 marks the end of the resetting pulse IRN, the duration of which, added to that of the charge injection pulse IIC, forms the restoring stage TR, with the row potential V'L going back to the rest value V'L1 at the instant t'0.

This description of the arrangement of the photosensitive dots P1 to P9 of the addressing and reading methods is given as a non-restrictive example, and modifications may be made while, at the same time, remaining within the scope of the invention. Thus, for example, with a mode of operation that is very close to the one explained, but on the basis of a slightly modified addressing mode, it is possible, notably in the case illustrated in FIG. 7, to reverse the direction of conduction of the first diode Da so that the two diodes Da, Db or Dbz are mounted upside down with respect to each other. It is also possible, by modifying the adressing mode, to make the first diode Da go into forward mode during the restoring period TR, so as to obtain an erasure of any remanence introduced by carriers trapped in the amorphous silicon. It is equally possible to permutate the positions of the first and second diodes solely by modifying the control signals. It should be furthermore pointed out that the first dipole element 4 may be formed not only by a diode Da or by a capacitor Ci, but that it may be formed also by a phototransistor with floating base of the NIPIN type, for example, thus making it possible to further improve the photosensitivity of the device. A NIPIN transistor is a structure with five superimposed, semiconducting layers, which can be easily made of amorphous silicon: by successive deposits of an N type silicon layer, a relative thick intrinsic silicon layer, a very thin P type layer, a very thin intrinsic layer, and an N type layer.

It should be noted that, with the schemes of photosensitive dots proposed by the present invention, the photodetection function is independent of the amplifier function fulfilled by the transistor T, so that irrespectively of the type of technological embodiment chosen for the amplification transistor T, it is possible to make the photodetection elements Da, Ci, Db of amorphous silicon, and thus obtain the benefit of the weak dark current and the improved quantum yield provided by this material.

Thus, for example, if the photosensitive device is designed for television camera shooting (in high-definition television), the transistor T may be made of monocrystalline silicon with channel, in volume (to reduce its noise).

FIG. 9 is a sectional view that schematically shows the structure of a photosensitive dot according to the invention, where the transistor T is a formed on a substrate made of monocrystalline silicon.

On a P type substrate 32, the MOS type transistor is made in volume, by N type implantations to form the source 33 and the drain 34 and N- type implantation to form the channel 35. The sources 33 are all connected in columns which extend perpendicularly to the plane of the figure. The drains 34 are all connected to the supply voltage $V_{DD}$. A P+N junction is made in the drain 34. This junction forms the second diode Db. Furthermore, above the N- zone, a metallization is formed. This metallization constitutes the gate G of the transistor T and is separated from the N- zone by an insulating layer 39. An opaque and electrically conductive metallic layer 37 coats the entire unit and forms the point at floating potential A and further sets up the electrical connection for the gate G of the transistor and the P+ anode of the second diode Db. On the metallic layer 37 forming the point A, three semiconducting layers are then deposited uniformly on the unit. These three semiconducting layers are designed to form the first diode Da as an amorphous silicon PIN type diode, that is: firstly, a layer 40 of hydrogenated amorphous silicon doped with a P type impurity, boron for example, then a layer 41 of intrinsic hydrogenated amorphous silicon; then a layer 42 of hydrogenated amorphous silicon doped with an N type impurity, phosphorus for example. Finally, in a standard way, there then is a transparent, conductive metallic layer 43 made of indium-tin oxide (ITO) for example, which is etched perpendicularly to the columns 32 so as to form row conductors. The photosensitive dots thus formed are exposed to light on the layer 43 side forming the row conductors.

The advantages of this structure are, notably, that it enables the obtaining of very efficient characteristics for the transistor, maximum optical apertures, total immunity to smearing and ease of setting up contacts between the transistor gate and the diode Db.

FIG. 10 shows another embodiment where the transistor T is also of the MOS type in integrated circuit form as in the example of FIG. 8, i.e. made of monocrystalline silicon. In the non-restrictive example described, the two diodes Da, Db are also made with amorphous silicon. However, in this latter configuration, the second diode Db takes part also in the photodetection and, to this effect, it is placed on one and the same plane as the first diode Da.

As in the preceding example, we have the substrate 32 made of P type monocrystalline silicon as well as the N type implantations 33, 34 and the N- type implantation 35 to make the source, the drain and the channel respectively. Above this unit, there is the insulating layer 39, then the opaque metallic layer 37 which represents the point at floating potential A and forms the gate G of the transistor as well as the connection of this gate and of the two diodes Da, Db. On top of the opaque metallic layer 37, there is a stacking of three semiconducting layers 50, 51, 52 which, after etching, enable the formation of the first and second PIN type diodes Da, Db. The first layer 50 is made of hydrogenated amorphous silicon doped with a P type impurity, boron for example, and the next layer 51 is a thicker layer made of intrinsic hydrogenated amorphous silicon. The next layer 52 is made of hydrogenated amorphous silicon doped with an N type impurity, phosphorus for example. In the example shown in FIG. 9, the two diodes Da, Db thus mounted upside down with respect to each other, i.e. with opposite directions of conduction. On top of the three layers 50, 51, 52, there is a transparent, conductive metallic layer (ITO) which, after etching, forms the row conductors. A transparent insulating layer 54 covers the entire unit except for a top part 55 which is in contact with a conductive metallic layer 56, said conductive metallic layer 56 being also in contact with an end 57 of the drain 34 so as to make the electrical connection between this drain 34 and the cathode of the second diode Db, this conductive metallic layer 56 being connected to the supply voltage $V_{DD}$.

FIGS. 11 and 12 give an illustration, as a non-restrictive example, of a technological embodiment in the case where the amplfication transistor T is of the TFT or thin film transistor type, the depiction of the structure being restricted to only one photosensitive dot.

FIG. 11 is a top view illustrating, notably, the relative positions of the two diodes Da, Db and of the column and row conductors F1 to F3 and L1 to L3 as well as supply conductors 8 connected to the supply voltage $V_{DD}$. On the left-hand side of the FIG. 11, there is column conductor F1 to F3 and a supply conductor 8, these conductors being parallel. In a shallower plane than that of the column and supply conductors, a first hatched triangle with dashes represents the first diode Da, and a second rectangle with a smaller area than the former one, also hatched with dashes, represents the second diode Db. There is also a row conductor L1 to L3 located in a shallower plane than the two diodes Da, Db. FIG. 11 also shows a rectangle 63 located in a plane between the supply conductor 8 and the row conductor L1 to L3, fulfilling a function of electrical connection between the cathode of the second diode Da and the supply conductor 8. It must be noted that there is also a conductive metallized surface which sets up the electrical connection between the two diodes Da, Db as well as with the gate G of the amplifier transistor T, and which represents the point at floating potential A.

FIG. 12 gives a schematic view of the same photosensitive dot as the one in FIG. 10, but in a sectional view made along an axis X—X shown in FIG. 11, this axis being located at the level of the row conductor L1 to L3, and forming the line of a section made perpendicularly to the plane of the FIG. 11.

In this version, the substrate 65 is made of glass for example. On the substrate 65, the deposition of a conductive metallic layer makes it possible, after etching, to make two parallel conductors, one of which is a column conductor F1 to F3 and the other is a supply conductor 8 connected to the fixed supply voltage $V_{DD}$, these two conductors being separated by an interval 66. The two conductors F1 to F3 and 8 are each coated with with a layer 68, 69 of N doped amorphous silicon, designed respectively to form the source and the drain of the amplification transistor T. Then, on top of the N doped layers 68, 69 and in the gap 66, there is a layer 70 of intrinsic, hydrogenated amorphous silicon. Then, on top of this layer 70, there is deposited an insulating layer 90, made of silicon nitride for example, above which there is then an opaque, conductive metallic layer 71 extending also on a part of the substrate or support 65 made of glass. This metallic layer 71 is designed to form the point at floating potential A, and a part of this layer 71 located above the layer 70 of intrinsic hydrogenated amorphous silicon, and more particularly above the gap 66 between the two N doped layers 68, 69, is designed to form the control gate G of the MOS type transistor T. Above the metallic layer 71 forming the point A, there are three layers 73, 74, 75 of hydrogenated amorphous silicon: firstly, the layer 73 doped with a P type impurity, then the layer 74 made of intrinsic silicon, then the layer 75 made of N doped silicon. These three layers 73, 74, 75 form the first PIN type diode Da. A conductive, metallic layer 77, which is transparent (made of ITO), covers the layer 75 of the first diode Da in order to achieve an efficient distribution of the electrical fields. The unit is coated with a conductive metallic layer 80 which is etched so as to form a row conductor L1 to L3. The second diode Db is not shown in FIG. 11 because, in view of the plane of the section, this second diode Db is located in a plane that is closer than the plane of the figure. Nevertheless, it will be understood that the two diodes Da and Db can be made from the same semiconducting layers 73, 74, 75, but in being separated (as shown in FIG. 11) by an etching operation. The diodes Da, Db are exposed to the light signal on the conductive layer 80 side, used to form the row conductors L1 to L3.

The main object of the description pertaining to FIGS. 9, 10, 11 and 12 is to show the architecture and relative arrangement of the photosensitive dots, the electrical diagram of which is given, notably, in FIGS. 2, 3 and 7. The techniques needed to make the structures shown, as regards both the making of the transistors T using the techniques of integrated circuits, and the making of these transistors according to the thin film technique, are known per se. It is clear that other embodiments may lead to the making of photosensitive dots according to the diagrams of FIGS. 2, 3, 7, without in any way thereby going beyond the scope of the invention.

What is claimed is:

1. A photosensitive device comprising at least one row conductor intersected with at least one column conductor, a photosensitive dot being formed substantially at each intersection between a row conductor and a column conductor, the photosensitive dot comprising at least one first dipole element and one second dipole element, mounted in series, at least one of which is a photosensitive element, the meeting point or zone of the two dipoles forming a point at floating potential at which there are stored electrical charges generated by an exposure to light of the photosensitive dot, the first dipole being connected to a row conductor by its end or pole opposite to the point at floating potential, a device further comprising a tripole element of the transistor type, a first pole of which forms the control gate, said control gate being connected to the point at floating potential, a second pole of the transistor being connected to the column conductor, the third pole of the transistor being connected, at the same time, on the one hand to a supply voltage and, on the other hand, to the second dipole by a pole or end of the latter, opposite the point at floating potential.

2. A photosensitive device according to claim 1, wherein the first dipole element is a diode.

3. A photosensitive device according to claim 2, wherein the diode is made of amorphous silicon.

4. A photosensitive device according to claim 1, wherein the first dipole element is a floating base transistor.

5. A photosensitive device according to claim 4, wherein the floating base transistor is made of amorphous silicon.

6. A photosensitive device according to claim 1, wherein the first dipole is an insulating capacitor.

7. A photosensitive device according to claim 6, wherein the dielectric of the insulating capacitor is a photoconductive material of the intrinsic amorphous silicon type.

8. A photosensitive device according to claim 1, wherein the second dipole element is a diode called a restoring diode.

9. A photosensitive device according to claim 8, wherein the restoring diode is made of amorphous silicon.

10. A photosensitive device according to claim 1, wherein the first and second dipole elements are formed by diodes mounted in series with opposite directions of conduction.

11. A photosensitive device according to claim 1, wherein the transistor is made using monocrystalline silicon.

12. A photosensitive device according to claim 11, wherein the transistor is of the MOS type.

13. A photosensitive device according to claim 1, wherein the transistor is made using amorphous silicon.

14. A photosensitive device according to claim 13, wherein the transistor is of the thin film type.

15. A photosensitive device according to claim 14, wherein the transistor is a MOS transistor.

16. A photosensitive device according to claim 8, wherein the restoring diode has a first voltage for being put into conduction with forward bias and a second voltage threshold for being put into conduction with reverse bias.

17. A photosensitive device according to one of the preceding claims, further comprising means to apply, to the row conductor:
   firstly, a rest voltage level to the row conductor during a stage of exposure to light;
   then, at least one voltage pulse called a reading pulse having a level greater than a conduction threshold of the transistor;
   then a voltage pulse called a restoring pulse, tending to put the second dipole, located between the point at floating potential and the supply voltage, in the "on" state.

18. A photosensitive device according to claim 16, further comprising means to apply, to the row conductor:
   firstly, a rest voltage level to the row conductor during a stage of exposure to light;
   then, at least one voltage pulse called a reading pulse having an amplitude greater than a conduction threshold of the transistor;
   then at least one voltage pulse called a charge injection pulse having a sign opposite that of the reading pulse;
   finally a voltage pulse, called a resetting pulse, having a same sign as the reading pulse, the amplitude of the resetting pulse being substantially greater than the difference between the value of the voltage threshold for being put into conduction with forward bias and the voltage threshold for being put into conduction with reverse bias.

* * * * *